(12) United States Patent
Chen et al.

(10) Patent No.: US 11,373,996 B2
(45) Date of Patent: Jun. 28, 2022

(54) SILICON-CONTROLLED-RECTIFIER ELECTROSTATIC PROTECTION STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Guang Chen, Shanghai (CN); Jie Chen, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 13 days.

(21) Appl. No.: 16/823,556

(22) Filed: Mar. 19, 2020

(65) Prior Publication Data
US 2020/0303369 A1 Sep. 24, 2020

(30) Foreign Application Priority Data
Mar. 20, 2019 (CN) .......................... 201910213723.2

(51) Int. Cl.
*H01L 27/02* (2006.01)
*H01L 29/10* (2006.01)
(Continued)

(52) U.S. Cl.
CPC ...... *H01L 27/0262* (2013.01); *H01L 29/0615* (2013.01); *H01L 29/1095* (2013.01); *H01L 29/747* (2013.01)

(58) Field of Classification Search
CPC ............... H01L 29/808; H01L 29/0692; H01L 29/1095; H01L 29/0634; H01L 29/7835; H01L 29/66901; H01L 29/7816; H01L 29/1066; H01L 29/78; H01L 29/66681; H01L 29/7809; H01L 29/0615;
(Continued)

(56) References Cited

U.S. PATENT DOCUMENTS 8,384,158 B2 * 2/2013 Su ........................... H01L 23/60
257/360
10,504,886 B1 * 12/2019 Yam .................... H01L 29/0619
(Continued)

*Primary Examiner* — Natalia A Gondarenko
(74) *Attorney, Agent, or Firm* — Anova Law Group, PLLC

(57) ABSTRACT

A silicon-controlled-rectifier electrostatic protection structure and a fabrication method are provided. The structure includes: a substrate of P-type; a first N-type well, a second N-type well, and a third N-type well in the substrate; a first P-type doped region in the first N-type well; first N-type doped regions at sides of the first N-type well along a first direction; first gate structures on a portion of the first N-type doped regions and on a portion of the first P-type doped region; second gate structure groups at sides of the first N-type well along a second direction; second N-type doped regions in the substrate at sides of each second gate structure along the first direction; second P-type doped regions in the second N-type doped regions between adjacent second gate structure groups; and a third P-type doped region and a cathode N-type doped region in the substrate.

20 Claims, 5 Drawing Sheets

(51) Int. Cl.
*H01L 29/06* (2006.01)
*H01L 29/747* (2006.01)

(58) Field of Classification Search
CPC ............. H01L 29/0661; H01L 29/0623; H01L 29/0865; H01L 29/0886; H01L 29/41725; H01L 29/4238; H01L 29/0834; H01L 29/73; H01L 29/8086; H01L 29/7801; H01L 29/7811; H01L 29/0619; H01L 29/0649; H01L 29/0653; H01L 29/0696; H01L 29/7832; H01L 29/0847; H01L 29/66659; H01L 29/7838; H01L 29/0843; H01L 29/0882; H01L 29/1083; H01L 29/41758; H01L 29/42316; H01L 29/6606; H01L 29/66893; H01L 29/66568; H01L 29/66674; H01L 29/70; H01L 29/7424; H01L 27/0259; H01L 27/0262; H01L 27/0266; H01L 27/0623; H01L 27/098; H01L 27/0617; H01L 27/0296; H01L 27/0255; H01L 29/747; H01L 29/7412; H01L 29/87; H01L 29/861
USPC ......................................... 257/173, 119, 360
See application file for complete search history.

(56) References Cited

U.S. PATENT DOCUMENTS

| | | | |
|---|---|---|---|
| 10,629,715 B2* | 4/2020 | Stefanov | H01L 27/0262 |
| 2012/0056238 A1* | 3/2012 | Chen | H01L 29/87 257/119 |
| 2016/0056146 A1 | 2/2016 | Li et al. | |
| 2017/0194314 A1* | 7/2017 | Lee | H01L 29/861 |
| 2018/0068996 A1* | 3/2018 | Lee | H01L 29/7408 |
| 2018/0301445 A1* | 10/2018 | Yam | H01L 27/0262 |

* cited by examiner

SILICON-CONTROLLED-RECTIFIER ELECTROSTATIC PROTECTION STRUCTURE AND FABRICATION METHOD THEREOF

CROSS-REFERENCES TO RELATED APPLICATION

This application claims the priority of Chinese Patent Application No. 201910213723.2, filed on Mar. 20, 2019, the content of which is incorporated herein by reference in its entirety.

TECHNICAL FIELD

The present disclosure generally relates to the field of semiconductor technologies and, more particularly, relates to a silicon-controlled-rectifier electrostatic protection structure and its fabrication method.

BACKGROUND

In fabrication and application of integrated circuit chips, with continuous improvement of very-large-scale-integrated-circuit processes, fabrication of complementary-metal-oxide-semiconductor (CMOS) integrated circuits enters a deep sub-micrometer stage. Size of metal-oxide-semiconductor (MOS) devices becomes smaller, and thickness of a gate oxidation layer becomes thinner. Correspondingly, a voltage withstanding capability of the MOS devices is significantly reduced. Damage on the integrated circuits induced by electrostatic discharge (ESD) becomes more serious, and ESD protection of the integrated circuits becomes more important.

To improve the protection against static electricity, an electrostatic protection circuit is usually connected to input/output pads (I/O pads) of a chip. The electrostatic protection circuit provides a discharge path of electrostatic currents in internal circuits of the chip, to avoid a breakdown of the internal circuits of the chip induced by the static electricity.

However, electrostatic protection structures formed by current technologies have poor performance. Therefore, there is a need to provide an electrostatic protection structure with improved performance and its fabrication method.

SUMMARY

One aspect of the present disclosure provides a silicon-controlled-rectifier electrostatic protection structure. The structure includes: a substrate of P-type; a first N-type well; a second N-type well; a third N-type well; a first P-type doped region in a top part of an edge region of the first N-type well; first N-type doped regions located in the substrate at sides of the first N-type well and arranged along a first direction; first gate structures on a portion of the first N-type doped regions and on a portion of the first P-type doped region; a plurality of second gate structure groups at both sides of the first N-type well along a second direction; second N-type doped regions; second P-type doped regions; a third P-type doped region in the substrate; a cathode N-type doped region in the substrate. The first N-type well, the second N-type well, and the third N-type well are disposed in the substrate. The second N-type well is disposed at sides of the first N-type well to surround the first N-type well. The third N-type well is disposed under a bottom of the first N-type well. The third N-type well is connected to the first N-type well 201 and to a bottom of the second N-type well. The first N-type doped regions located at both sides of the first N-type well are disposed in the substrate between the first N-type well and the second N-type well. The first N-type doped regions adjoin the first P-type doped region. The plurality of second gate structure groups located at both sides of the first N-type well are disposed on the substrate between the first N-type well and the second N-type well. Each of the plurality of second gate structure groups includes two second gate structures arranged along the first direction. The second direction is perpendicular to the first direction. The second N-type doped regions are disposed in the substrate at both sides of each second gate structure along the first direction. The second N-doped regions are separated from the first N-type well and from the second N-type well. The second N-type doped regions at both sides of the plurality second gate structure groups along the first direction adjoin the first N-type doped regions. The second P-type doped regions are disposed in a portion of the second N-type doped regions between adjacent second gate structure groups of the plurality of second gate structure groups along the first direction. The third P-type doped region surrounds the second N-type well while may be separated from the second N-type well. The third P-type doped region is electrically connected to the second N-type doped regions between adjacent second gate structures in each second gate structure group. The cathode N-type doped region surrounds the third P-type doped region while is separated from the third P-type doped region.

Another aspect of the present disclosure provides a fabrication method for a silicon-controlled-rectifier electrostatic protection structure. The method includes: providing a substrate of P-type; forming a first N-type well, a second N-type well, and a third N-type well in the substrate; forming a first P-type doped region in a top part of an edge region of the first N-type well; forming first N-type doped regions located in the substrate at sides of the first N-type well and arranged along a first direction; forming first gate structures on a portion of the first N-type doped regions and on a portion of the first P-type doped region; forming a plurality of second gate structure groups at both sides of the first N-type well along a second direction; second N-type doped regions; forming second P-type doped regions; and forming a third P-type doped region and a cathode N-type doped region in the substrate. The second N-type well is disposed at sides of the first N-type well to surround the first N-type well. The third N-type well is disposed under a bottom of the first N-type well and adjoins the first N-type well and to a bottom of the second N-type well. The first N-type doped regions located at both sides of the first N-type well are disposed in the substrate between the first N-type well and the second N-type well. The first N-type doped regions adjoin the first P-type doped region. The plurality of second gate structure groups located at both sides of the first N-type well 201 groups may be disposed on the substrate between the first N-type well and the second N-type well. Each of the plurality of second gate structure groups includes two second gate structures arranged along the first direction. The second direction is perpendicular to the first direction. The second N-type doped regions are disposed in the substrate at both sides of each second gate structure along the first direction and are separated from the first N-type well and from the second N-type well. The second N-type doped regions at both sides of the plurality second gate structure groups along the first direction adjoin the first N-type doped regions. The second P-type doped regions are disposed in a portion of the second N-type doped regions between adjacent second gate structure groups of the plurality of second gate structure groups along the first direction. The third P-type doped region surrounds the second N-type well and is separated from the second N-type well. The third P-type doped region is electrically connected to the second N-type doped regions between adjacent second gate structures in each second gate structure group. The cathode N-type doped region surrounds the third P-type doped region and is separated from the third P-type doped region.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
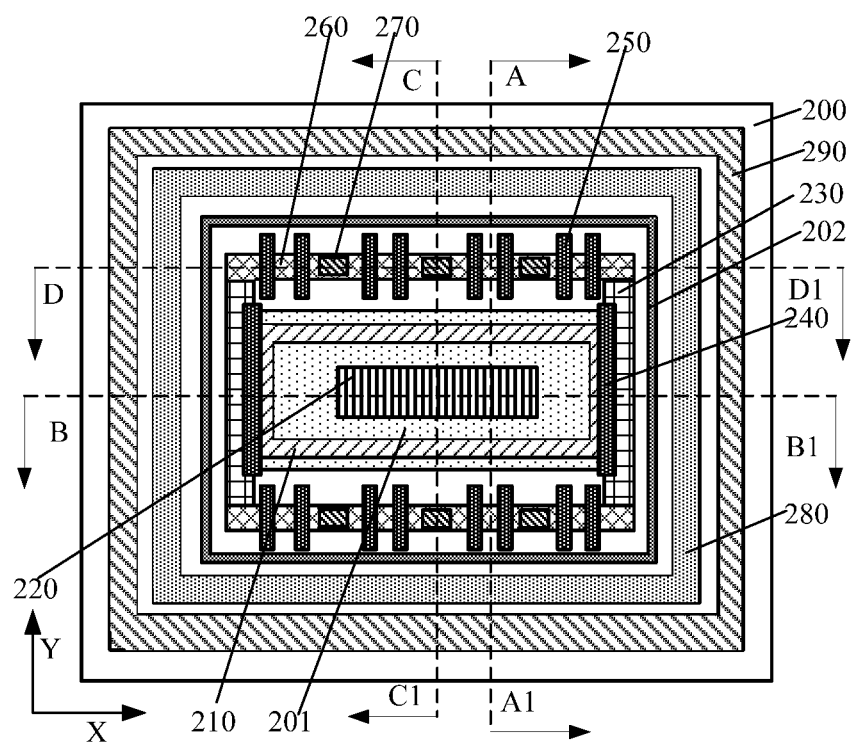
FIG. 1 illustrates a silicon-controlled-rectifier (SCR) electrostatic protection structure according to various disclosed embodiments of the present disclosure.
Figure 2:
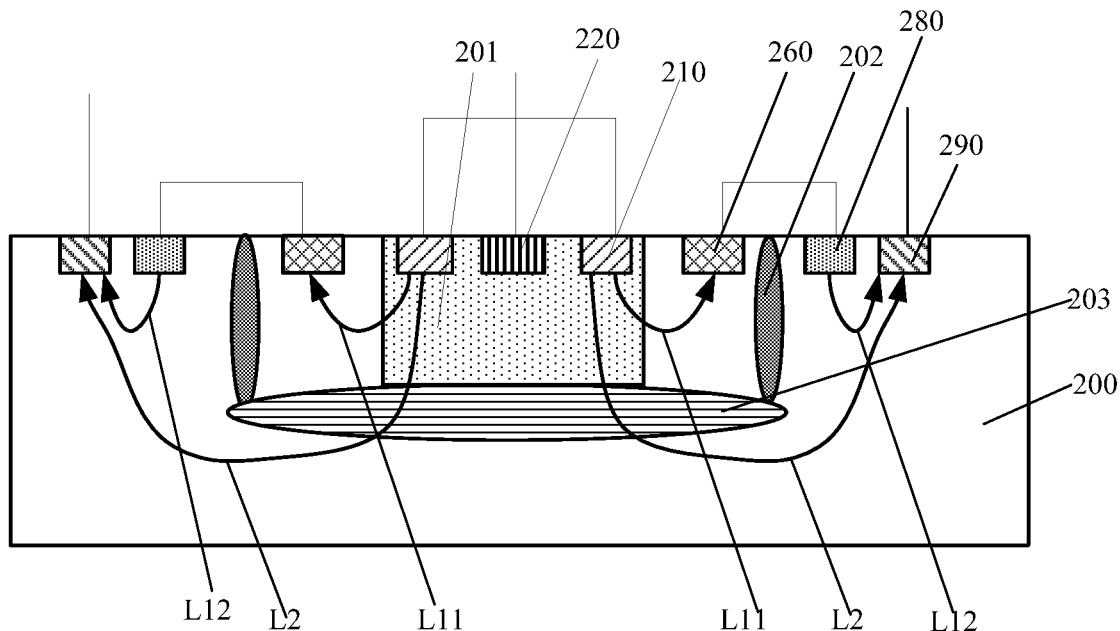
FIG. 2 illustrates a cross-section view of the SCR electrostatic protection structure in FIG. 1 along an A-A1 direction.
Figure 3:
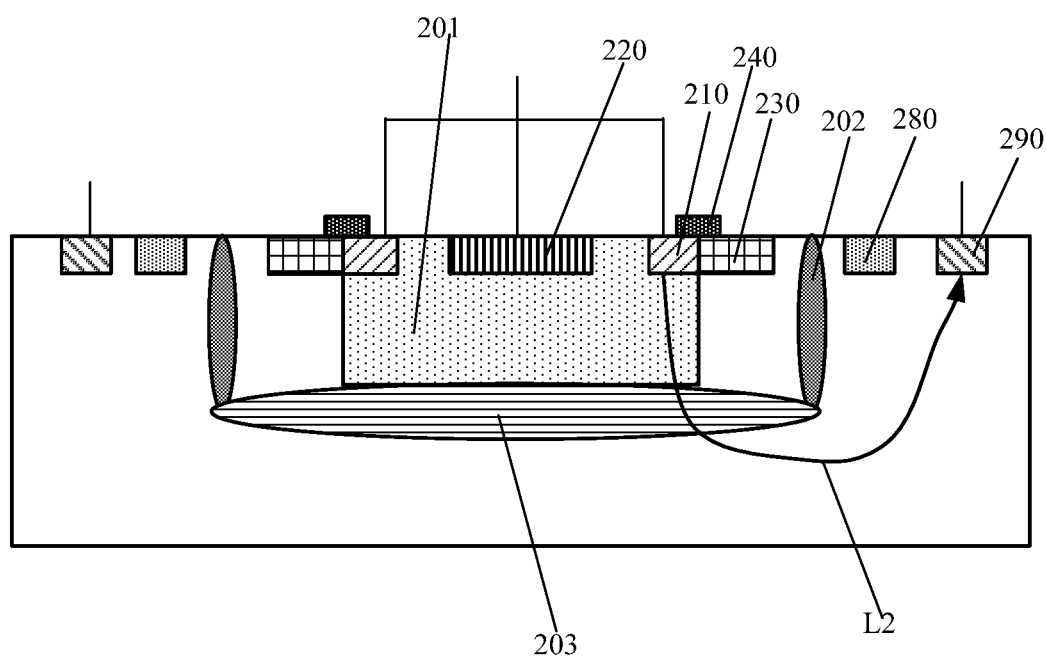
FIG. 3 illustrates a cross-section view of the SCR electrostatic protection structure in FIG. 1 along a B-B1 direction.
Figure 4:
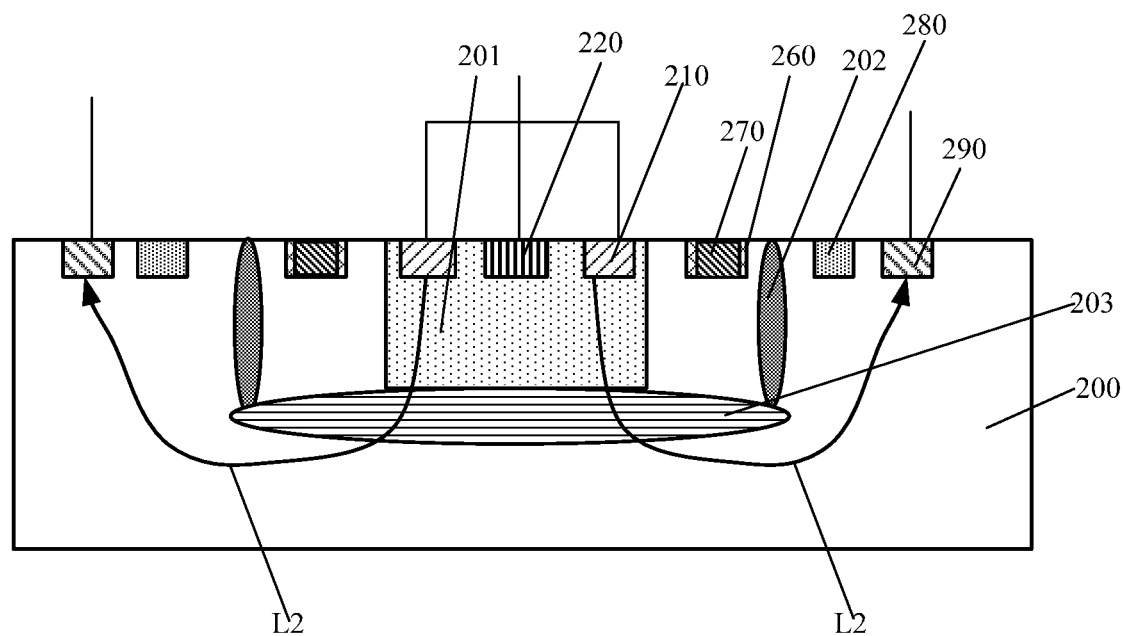
FIG. 4 illustrates a cross-section view of the SCR electrostatic protection structure in FIG. 1 along a C-C1 direction.
Figure 5:
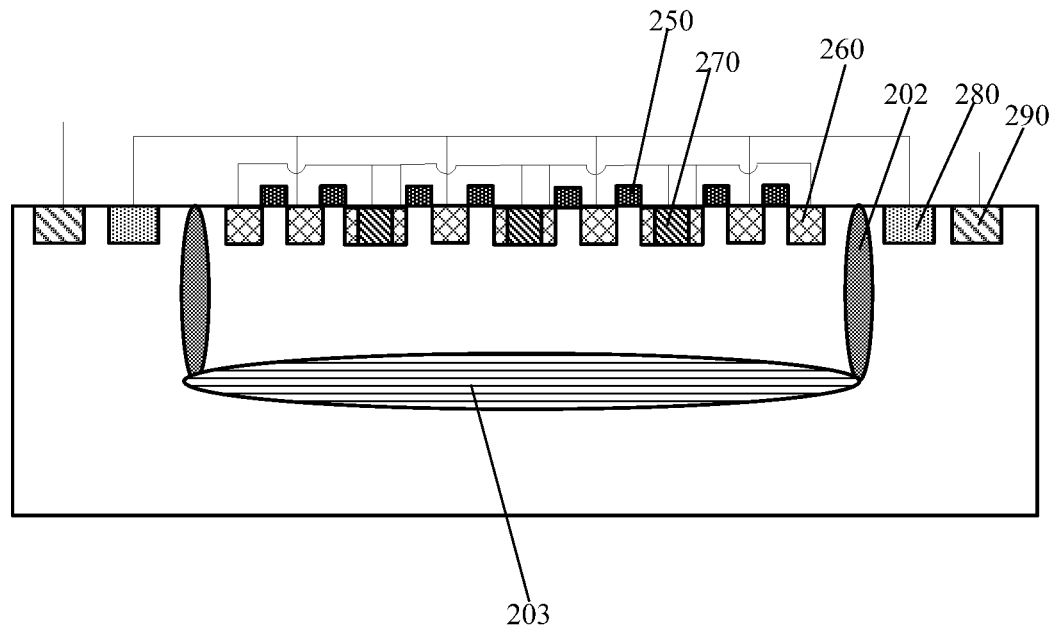
FIG. 5 illustrates a cross-section view of the SCR electrostatic protection structure in FIG. 1 along a D-D1 direction.

Reference will now be made in detail to exemplary embodiments of the disclosure, which are illustrated in the accompanying drawings. Wherever possible, the same reference numbers will be used throughout the drawings to refer to the same or like parts.

An SCR electrostatic protection structure has two important parameters including holding voltage and trigger voltage. The SCR electrostatic protection structures develop toward a direction with higher holding voltage and lower trigger voltage. There is a need to further increase the holding voltage and lower the trigger voltage of the SCR electrostatic protection structures.

The present disclosure provides an SCR electrostatic protection structure. The structure may include: a Substrate of P-type; a first N-type well; a second N-type well; a third N-type well; a first P-type doped region in a top part of an edge region of the first N-type well; first N-type doped regions located in the substrate at sides of the first N-type well and arranged along a first direction; first gate structures on a portion of the first N-type doped regions and on a portion of the first P-type doped region; a plurality of second gate structure groups at both sides of the first N-type well along a second direction; second N-type doped regions; second P-type doped regions; a third P-type doped region in the substrate; a cathode N-type doped region in the substrate. The first N-type well, the second N-type well, and the third N-type well may be disposed in the substrate. The second N-type well may be disposed at sides of the first N-type well to surround the first N-type well. The third N-type well may be disposed under a bottom of the first N-type well. The third N-type well may be connected to the first N-type well 201 and to a bottom of the second N-type well. The first N-type doped regions located at both sides of the first N-type well may be disposed in the substrate between the first N-type well and the second N-type well. The first N-type doped regions may adjoin the first P-type doped region. The plurality of second gate structure groups located at both sides of the first N-type well may be disposed on the substrate between the first N-type well and the second N-type well. Each of the plurality of second gate structure groups may include two second gate structures arranged along the first direction. The second direction may be perpendicular to the first direction. The second N-type doped regions may be disposed in the substrate at both sides of each second gate structure along the first direction. The second N-doped regions may be separated from the first N-type well and from the second N-type well. The second N-type doped regions at both sides of the plurality second gate structure groups along the first direction may adjoin the first N-type doped regions. The second P-type doped regions may be disposed in a portion of the second N-type doped regions between adjacent second gate structure groups of the plurality of second gate structure groups along the first direction. The third P-type doped region may surround the second N-type well while may be separated from the second N-type well. The third P-type doped region may be electrically connected to the second N-type doped regions between adjacent second gate structures in each second gate structure group. The cathode N-type doped region may surround the third P-type doped region while may be separated from the third P-type doped region.

As illustrated in FIGS. 1-5, in one embodiment, the SCR electrostatic protection structure may include: a Substrate of P-type 200; a first N-type well 201; a second N-type well 202; a third N-type well 203; a first P-type doped region 210; first N-type doped regions 230; first gate structures 240a plurality of second gate structure groups; second N-type doped regions 260; second P-type doped regions 270; a third P-type doped region 280 in the substrate 200; and a cathode N-type doped region 290 in the substrate 200.

The first N-type well 201, the second N-type well 202, and the third N-type well 203 may be disposed in the substrate 200. The second N-type well 202 may be disposed at sides of the first N-type well 201 to surround the first N-type well 201. The third N-type well 203 may be disposed under a bottom of the first N-type well 201. The third N-type well 203 may be connected to the first N-type well 201 and to a bottom of the second N-type well 202.

The first P-type doped region 210 may be located in a top part of an edge region of the first N-type well 201.

The first N-type doped regions 230 may be located in the substrate 200 at both sides of the first N-type well 201 and arranged along a first direction X. The first N-type doped regions 230 located at both sides of the first N-type well 201 may be disposed in the substrate 200 between the first N-type well 201 and the second N-type well 202. The first N-type doped regions 230 may adjoin the first P-type doped region 210.

The first gate structures 240 may be located on a portion of the first N-type doped regions 230 and on a portion of the first P-type doped region 210.

The plurality of second gate structure groups may be located at both sides of the first N-type well 201 along a second direction Y. The plurality of second gate structure located at both sides of the first N-type well 201 groups may be disposed on the substrate 200 between the first N-type well 201 and the second N-type well 202. Each of the plurality of second gate structure groups may include two second gate structures 205 arranged along the first direction X. The second direction Y is perpendicular to the first direction X.

The second N-type doped regions 260 may be disposed in the substrate 200 at both sides of each second gate structure 250 along the first direction X. The second N-doped regions 260 may be separated from the first N-type well 201 and from the second N-type well 202. The second N-type doped regions 260 at both sides of the plurality second gate structure groups along the first direction X may adjoin the first N-type doped regions 230.

The second P-type doped regions 270 may be disposed in a portion of the second N-type doped regions 260 between adjacent second gate structure groups of the plurality of second gate structure groups along the first direction X.

The third P-type doped region 280 may surround the second N-type well 202 while may be separated from the second N-type well 202. The third P-type doped region 280 may be electrically connected to the second N-type doped regions 260 between adjacent second gate structures 250 in each second gate structure group.

The cathode N-type doped region 290 may surround the third P-type doped region 280 while may be separated from the third P-type doped region 280.

For description purposes only, the embodiments where the substrate 200 is a planar semiconductor substrate will be used as examples to illustrate the present disclosure and should not limit the scopes of the present disclosure. In various embodiments, the substrate 200 may be any suitable substrate.

A conductive type of the substrate 200 may be P-type, and the substrate 200 may be made of a material including single-crystalline silicon, single-crystalline germanium, and single-crystalline SiGe.

A top surface of the substrate 200 may expose the first N-type well 201 and the second N-type well 202. A top surface of the first N-type well 201 may be flush with the top surface of the substrate 200 and a top surface of the second N-type well 202 may be flush with the top surface of the substrate 200.

A depth of the third N-type well 203 in the substrate 200 may be larger than a depth of the first N-type well 201 in the substrate 200.

A concentration of N-type ions in the third N-type well 203 may be smaller than a concentration of N-type ions in the first N-type well 201, and also smaller than a concentration of N-type ions in the second N-type well 202. In one embodiment, the concentration of the N-type ions in the third N-type well 203 may be about a half to ¾ of the concentration of the N-type ions in the first N-type well 201.

Since the concentration of the N-type ions in the third N-type well 203 may be small, after a second electrical current discharging path is turned on subsequently, a corresponding turning-on resistance may be large. A holding voltage may be improved.

The third N-type well 203 may adjoin the first N-type well 201. The third N-type well 203 may also adjoin the bottom of the second N-type well 202. Correspondingly, the third N-type well 203 and the second N-type well 202 may form a semi-enclosed structure together. A portion of the substrate 200 above the third N-type well 203 and between the second N-type well 202 and the first N-type well 201 may be separated from another portion of the substrate 200 under the third N-type well 203. Also, a portion of the substrate 200 at a side of the second N-type well 202 toward the first N-type well 201 may be separated from a portion of the substrate 200 at a side of the second N-type well 202 away from the first N-type well 201.

The SCR electrostatic protection structure may further include: an anode N-type doped region 220 in the top region of the first N-type well 201. The first P-type doped region 210 may surround while be discrete from the anode N-type doped region 220. The anode N-type doped region 220 may be electrically connected to the first P-type doped region 210.

In one embodiment, the first P-type doped region 210 may have a ring structure.

The SCR electrostatic protection structure may further include a first connecting line 2001. The first connecting line 2001 may electrically connect the anode N-type doped region 220 to the first P-type doped region 210.

The first connecting line 2001 may be made of metal.

In one embodiment, the first N-type doped regions 203 may be located at the both sides of the first N-type well 201 and arranged along the first direction X. The first N-type doped region 230 located at both sides of the first N-type well 201 may be located in the substrate 200 between the first N-type well 201 and the second N-type well 202, and adjacent to the first P-type doped region 210.

The first gate structures 240 may extend along the second direction Y, and the second gate structures 250 may extend along the second direction Y.

Each of the first gate structures 240 may be disposed on a portion of a corresponding first N-type doped region 230, and may extend along the first direction X into a space above a portion of the first P-type doped region 210 adjacent to the corresponding first N-type doped region 203.

The plurality of second gate structure groups may be disposed at both sides of the first N-type well 201 along the second direction Y. Each of the plurality of second gate structure groups may only include two second gate structures 250.

The second gate structures 250 may be separated from the first N-type well 201 and from the second N-type well 202. Each of the second gate structures 250 may be separated from each other.

The second N-type doped regions 260 at both sides of the plurality of second gate structure groups along the first direction may adjoin the first N-type doped regions 230 means: second gate structure groups at each side of the first N-type well 201 along the second direction Y may form an integrity, and the second N-type doped regions 260 at sides of the integrity along the first direction X may adjoin the first N-type doped regions 230. The second N-type doped regions 260 between adjacent second gate structures 250 may not be adjacent and not connected to the first N-type doped regions 230.

The second N-type doped regions 260 in the substrate 200 at the both sides of each second gate structure 250 along the first direction X may be discrete. For each second gate structure 250, a second N-type doped region 260 at a side of the second gate structure 250 along the first direction may be used as a source region, and a second N-type doped region 260 at another side of the second gate structure 250 along the first direction may be used as a drain region. A second N-type doped region 260 between two adjacent second gate structure groups along the first direction X may be used as a drain region, the second N-type doped regions 260 at both sides of the integrity formed by the plurality of second gate structure groups along the first direction X may be used as drain regions, while second N-type doped regions 260 between adjacent second gate structures 250 in each second gate structure group may be used as a source region.

For the source regions and the drain regions at sides of each second gate structure, each drain region may be electrically connected to each other and each source region may be electrically connected to each other. The source regions may be not electrically connected to the drain regions. In one embodiment, the second N-type doped regions 260 between adjacent second gate structures 250 in each second gate structure group may be electrically connected to each other, and also may be electrically connected to the third P-type doped region 280. The second N-type doped regions 260 between adjacent second gate structure groups along the first direction X may be electrically connected to the second P-type doped regions 270, and may be electrically connected to the second N-type doped regions 260 at both sides of the integrity formed by the plurality of second gate structure groups along the first direction X. Each of the second P-type doped regions 270 may be electrically connected to each other.

In one embodiment, the first N-type doped regions 230 may be not connected to the third P-type doped region 280 through conductive lines. For the drain regions at sides of each second gate structure groups, each drain region may be not connected to the third P-type doped region through conductive lines.

Bottom surfaces of the second P-type doped regions 270 may be flush with bottom surfaces of the second N-type doped regions 260.

The SCR electrostatic protection structure may further include second connecting lines. For each second connecting line, an end of the second connecting line may be connected to a corresponding second N-type doped region 260 between two adjacent second gate structure groups in each second gate structure group along the first direction X, and another end may be electrically connected to the third P-type doped region 280.

The SCR electrostatic protection structure may further include third connecting lines. The third connecting lines may electrically connect the second N-type doped regions 260 between adjacent second gate structure groups along the first direction X, the second P-type doped regions 270, and the second N-type doped regions 260 at sides of the plurality of second gate structure groups along the first direction X.

The second connecting lines and the second connecting lines may be made of metals.

The SCR electrostatic protection structure may include a first current discharge structure and a second current discharge structure.

Figure 6:
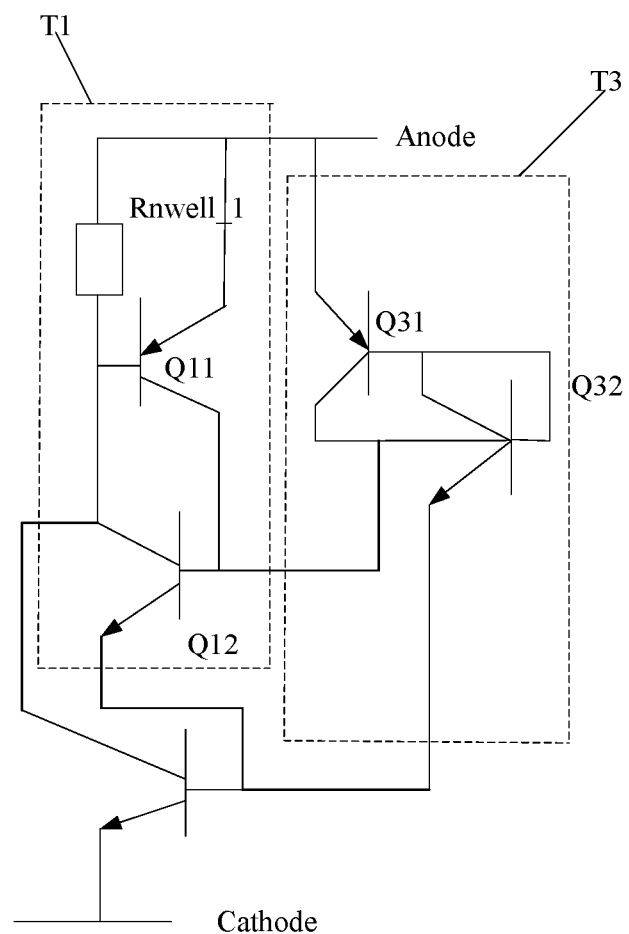
FIG. 6 illustrates an equivalent circuit diagram corresponding to a first current discharge structure and a first trigger structure of the SCR electrostatic protection structure in FIG. 1.

As illustrated in FIG. 6, the first current discharge structure T1 may be a PNPN structure, and may include a first PNP transistor Q11 and a first PNP transistor Q12. The first P-type doped region 210 may be used as an emission electrode of the first PNP transistor Q11, the first N-type well 201 may be use as a base electrode of the first PNP transistor Q11, and a first portion of the substrate 200 surrounded by the first N-type well 201, the second N-type well 202, and the third N-type well 203 may be used as a collection electrode of the first PNP transistor Q11. For the first NPN transistor Q12, the first N-type well 201 may be used as a collection electrode, the first portion of the substrate 200 surrounded by the first N-type well 201, the second N-type well 202, and the third N-type well 203 may be used as a base electrode, and the second N-type doped regions 260 between adjacent second gate structures 250 in each second gate structure group may be used as an emission electrode. The first PNP transistor Q11 and the first NPN transistor Q12 may be connected as illustrated in FIG. 6.

The second current discharge structure T2 may have a PNPN structure, and may include a second PNP transistor Q21 and a second NPN transistor Q22. For the second PNP transistor Q21, the first P-type doped region 210 may be used as an emission electrode, the first N-type well 201 and the third N-type well 203 may be used together as a base electrode, and a second portion of the substrate 200 outside the third N-type well and the second N-type well 202 may be used as a collection electrode. The second portion of the substrate 200 outside the third N-type well and the second N-type well 202 may include a portion of the substrate 200 under the bottom of the third N-type well 203 and another portion of the substrate 200 at a side of the second N-type well opposite to the first N-type well 201. For the second NPN transistor Q22, the first N-type well 201 and the third N-type well 203 may be used together as a collection electrode, the second portion of the substrate 200 outside the third N-type well and the second N-type well 202 may be used as a base electrode, the cathode N-type doped region 290 may be used as an emission electrode. The second PNP transistor Q21 and the second NPN transistor Q22 may be connected as illustrated in FIG. 7.

The SCR electrostatic protection structure may have two types of current discharge paths, namely a first current discharge path L1 and a second current discharge path L2. The first current discharge path L1 may include a first sub current discharge path L11 and a second sub current discharge path L12. The first sub current discharge path L11 may correspond to the first current discharge structure T1. In the second sub current discharge path L12, current may flow from the third P-type doped region 280 to the cathode N-type doped region 290 through the substrate 200 adjacent to the third P-type doped region 280.

Figure 7:
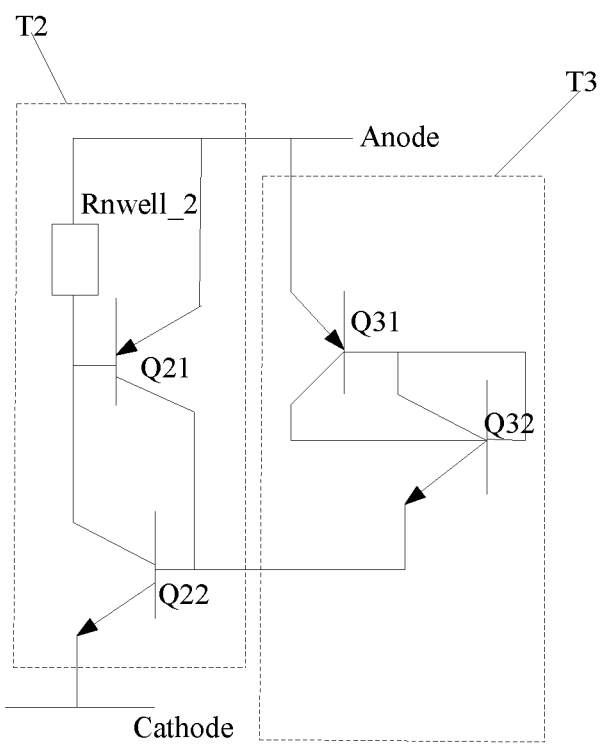
FIG. 7 illustrates an equivalent circuit diagram corresponding to a second current discharge structure and a second trigger structure of the SCR electrostatic protection structure in FIG. 1.

The SCR electrostatic protection structure may include a trigger structure T3 as illustrated in FIG. 6 and FIG. 7. The trigger structure T3 may include a third PNP transistor Q31 and a third NPN transistor Q32. For the third PNP transistor Q31, the first P-type doped region 210 may be used as an emission electrode, the first N-type doped regions 230 may be used as a base electrode, and the second P-type doped regions 270 may be used as a collection electrode. For the third NPN transistor Q32, the first N-type doped regions 230 may be used as a collection electrode, the second P-type doped regions 270 may be used as a base electrode, and the second N-type doped regions 260 between adjacent second gate structures 250 in each second gate structure group may be used as an emission electrode.

Because of the trigger structure T3, when applying voltage to the cathode and the anode, the third PNP transistor Q31 and the third NPN transistor Q32 in the trigger structure T3 may be positively conducting. A voltage of the substrate 200 may be increased and the first NPN transistor Q12 may be conducting correspondingly. The conducting first NPN transistor Q12 may pull down a voltage of the base electrode of the first PNP transistor Q11, to make the first PNP transistor Q11 conducting. Correspondingly, the first current discharge path may be triggered to discharge currents. Because of the trigger structure T3, when applying voltage to the cathode and the anode, the third PNP transistor Q31 and the third NPN transistor Q32 in the trigger structure T3 may be positively conducting. The voltage of the substrate 200 may be increased and the second NPN transistor Q22 may be conducting correspondingly. The conducting second NPN transistor Q22 may pull down a voltage of the base electrode of the second PNP transistor Q21, to make the second PNP transistor Q21 conducting. Correspondingly, the second current discharge path may be triggered to discharge currents. Because of a trigger function of the trigger structure T3, the first current discharge path and the second current discharge path may be triggered by a low trigger voltage to discharge currents. The trigger voltage of the SCR electrostatic protection structure may be reduced.

In the present disclosure, the third N-type well 203 in the second current discharge structure T2 may have a large depth, and a conductive resistance of the second current discharge path when the second current discharge path is conducting may be increased. The hold voltage of the SCR electrostatic protection structure may be increased. The first current discharge path may include the first sub current discharge path and the second sub current discharge path. The first current discharge path may be formed by serially connecting the first sub current discharge path and the second sub current discharge path. The hold voltage of the SCR electrostatic protection structure may be increased further. Correspondingly, for a semiconductor device protected by the SCR electrostatic protection structure, a voltage range for normal operation of the semiconductor device may be enlarged.

In the present disclosure, the trigger structure may be a parasitic device and may not occupy additional regions. A width of the first P-type doped region 210 may be larger than a size of the anode N-type doped region 220 along the first direction and may be larger than a width of the anode N-type doped region 220 along the second direction. The width of the first P-type doped region 210 may be a distance between an outer sidewall and an inner sidewall of the first P-type doped region. A size of the second P-type doped regions 270 along the second direction may be smaller than a size of the second N-type doped regions 260 along the second direction. A width of the third P-type doped region 280 may be smaller than a width of the cathode N-type doped region 290. Without affecting the trigger effect, areas occupied by the anode N-type doped region 220, the second P-type doped regions 270 and the third P-type doped region 280 may be small. A discharged current in a unit area may be increased. A level of the SCR electrostatic protection structure may be improved.

In the present disclosure, the trigger structure may be a parasitic trigger structure and an area of the SCR electrostatic protection structure may be reduced.

As illustrated in FIG. 6, the emission electrode of the first NPN transistor Q12 may be connected to the cathode N-type doped region 290 through the third P-type doped region 280, and Rwell_1 in FIG. 6 may be an equivalent resistance of the first N-type well 201. Rwell_2 in FIG. 7 may be a total equivalent resistance of the first N-type well 201 and the third N-type well 203.

The present disclosure also provides a fabrication method for forming an SCR electrostatic protection structure. The method may include: providing a substrate of P-type; forming a first N-type well, a second N-type well, and a third N-type well in the substrate; forming a first P-type doped region in a top part of an edge region of the first N-type well; forming first N-type doped regions located in the substrate at both sides of the first N-type well and arranged along a first direction; forming first gate structures on a portion of the first N-type doped regions and on a portion of the first P-type doped region; forming a plurality of second gate structure groups at both sides of the first N-type well along a second direction; forming second N-type doped regions; forming second P-type doped regions; forming a third P-type doped region and a cathode N-type doped region in the substrate.

The first N-type well, the second N-type well, and the third N-type well may be disposed in the substrate. The second N-type well may be disposed at sides of the first N-type well to surround the first N-type well. The third N-type well may be disposed under a bottom of the first N-type well. The third N-type well may be connected to the first N-type well 201 and to a bottom of the second N-type well.

The first N-type doped regions located at both sides of the first N-type well 201 may be disposed in the substrate between the first N-type well and the second N-type well. The first N-type doped regions may adjoin the first P-type doped region.

The plurality of second gate structure groups located at both sides of the first N-type well 201 groups may be disposed on the substrate between the first N-type well and the second N-type well. Each of the plurality of second gate structure groups may include two second gate structures arranged along the first direction. The second direction may be perpendicular to the first direction.

The second N-type doped regions may be disposed in the substrate at both sides of each second gate structure along the first direction. The second N-doped regions may be separated from the first N-type well and from the second N-type well. The second N-type doped regions at both sides of the plurality second gate structure groups along the first direction may adjoin the first N-type doped regions.

The second P-type doped regions may be disposed in a portion of the second N-type doped regions between adjacent second gate structure groups of the plurality of second gate structure groups along the first direction.

The third P-type doped region may surround the second N-type well while may be separated from the second N-type well. The third P-type doped region may be electrically connected to the second N-type doped regions between adjacent second gate structures in each second gate structure group.

The cathode N-type doped region may surround the third P-type doped region while may be separated from the third P-type doped region.

Another embodiment of the present disclosure may also provide another SCR electrostatic protection structure. In this embodiment, different from above embodiments, the substrate in the SCR electrostatic protection structure may include a semiconductor substrate and a plurality of fins on the semiconductor substrate. The plurality of fins may extend along the first direction. The second gate structures may cross a portion of the plurality of fins.

In this embodiment, the first current discharge path may penetrate the plurality of fins, and the second current discharge path may penetrate the plurality of fins. The discharged current may flow from a sidewall of a fin of the plurality of fins along a width direction to another sidewall of the fin along the width direction, by penetrating the fin. The discharge current may be increased, and the level of the SCR electrostatic protection structure may be improved.

The present disclosure also provides another fabrication method for forming above SCR electrostatic protection structures. The detail can be referred to the above discussions.

In the present disclosure, because of the trigger structure T3, when applying voltage to the cathode and the anode, the third PNP transistor Q31 and the third NPN transistor Q32 in the trigger structure T3 may be positively conducting. The voltage of the substrate 200 may be increased and the first NPN transistor Q12 may be conducting correspondingly. The conducting first NPN transistor Q12 may pull down a voltage of the base electrode of the first PNP transistor Q11, to make the first PNP transistor Q11 conducting. Correspondingly, the first current discharge path may be triggered to discharge currents. Because of the trigger structure T3, when applying voltage to the cathode and the anode, the third PNP transistor Q31 and the third NPN transistor Q32 in the trigger structure T3 may be positively conducting. A voltage of the substrate 200 may be increased and the second NPN transistor Q22 may be conducting correspondingly. The conducting second NPN transistor Q22 may pull down a voltage of the base electrode of the second PNP transistor Q21, to make the second PNP transistor Q21 conducting. Correspondingly, the second current discharge path may be triggered to discharge currents. Because of a trigger function of the trigger structure T3, the first current discharge path and the second current discharge path may be triggered by a low trigger voltage to discharge currents. The trigger voltage of the SCR electrostatic protection structure may be reduced. Further, the third N-type well 203 in the second current discharge structure T2 may have a large depth, and a conductive resistance of the second current discharge path when the second current discharge path is conducting may be increased. The hold voltage of the SCR electrostatic protection structure may be increased. The first current discharge path may include the first sub current discharge path and the second sub current discharge path. The first current discharge path may be formed by serially connecting the first sub current discharge path and the second sub current discharge path. The hold voltage of the SCR electrostatic protection structure may be increased further. Correspondingly, for a semiconductor device protected by the SCR electrostatic protection structure, a voltage range for normal operation of the semiconductor device may be enlarged.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A silicon-controlled-rectifier electrostatic protection structure, comprising:
    a substrate of P-type;
    a first N-type well, a second N-type well, and a third N-type well in the substrate;
    a first P-type doped region in a top part of an edge region of the first N-type well;
    first N-type doped regions located in the substrate at both sides of the first N-type well and arranged along a first direction;
    first gate structures on a portion of the first N-type doped regions and on a portion of the first P-type doped region;
    a plurality of second gate structure groups at both sides of the first N-type well along a second direction;
    second N-type doped regions;
    second P-type doped regions;
    a third P-type doped region in the substrate; and
    a cathode N-type doped region in the substrate, wherein:
        the second N-type well is disposed at sides of the first N-type well and surrounds the first N-type well, and the second N-type well is separated from the first N-type well;
        the third N-type well is disposed at a bottom of the first N-type well, and the third N-type well adjoins the first N-type well and adjoins a bottom of the second N-type well;
        the first N-type doped regions located at both sides of the first N-type well are disposed in the substrate between the first N-type well and the second N-type well;
        the first N-type doped regions adjoins the first P-type doped region;
        the plurality of second gate structure groups located at both sides of the first N-type well is disposed on the substrate between the first N-type well and the second N-type well;
        each of the plurality of second gate structure groups includes two second gate structures arranged along the first direction;
        the second direction is perpendicular to the first direction;
        the second N-type doped regions are disposed in the substrate at both sides of each second gate structure along the first direction, and are separated from the first N-type well and from the second N-type well;
        the second N-type doped regions at both sides of the plurality second gate structure groups along the first direction adjoin the first N-type doped regions;
        the second P-type doped regions are disposed in a portion of the second N-type doped regions between adjacent second gate structure groups along the first direction;
        the third P-type doped region surrounds the second N-type well and is separated from the second N-type well;
        the third P-type doped region is electrically connected to the second N-type doped regions between adjacent second gate structures in each second gate structure group;
        the cathode N-type doped region surrounds the third P-type doped region and is separated from the third P-type doped region; and
        each of the second N-type well, the third P-type doped region, and the cathode N-type doped region has a ring structure and sequentially surrounds the first N-type well.

2. The structure according to claim 1, further including an anode N-type doped region in the top part of the first N-type well, wherein:
    the first P-type doped region surrounds and is separated from the anode N-type doped region; and
    the anode N-type doped region is electrically connected to the first P-type doped region.

3. The structure according to claim 2, further including a first connecting line electrically connecting the anode N-type doped region to the first P-type doped region.

4. The structure according to claim 1, further including second connecting lines, wherein:
    for each second connecting line, an end is connected to a second N-type doped region between two adjacent second gate structures in each second gate structure group, and another end is connected to the third P-type doped region.

5. The structure according to claim 1, further including a third connecting line, wherein:

the third connecting line electrically connects the second N-type doped regions between adjacent second gate structure groups along the first direction, the second P-type doped regions, and the second N-type doped regions at both sides of the plurality of second gate structure groups along the first direction.

6. The structure according to claim 1, wherein:
a concentration of N-type ions in the third N-type well is smaller than a concentration of N-type ions in the first N-type well and is smaller than a concentration of N-type ions in the second N-type well.

7. The structure according to claim 6, wherein:
the concentration of the N-type ions in the third N-type well is about ½ to about ¾ of the concentration of the N-type ions in the first N-type well.

8. The structure according to claim 1, wherein:
the first P-type doped region has a ring structure;
the first N-type doped regions are located at both sides of the first N-type well along the first direction; and
the plurality of second gate structure groups is located at both sides of the first N-type well along the second direction.

9. The structure according to claim 1, wherein:
the substrate includes a semiconductor substrate and a plurality of fins on the semiconductor substrate; and
the plurality of fins extends along the first direction.

10. The structure according to claim 1, wherein:
the first gate structures and the second gate structures extend along the second direction.

11. A fabrication method for forming a silicon-controlled-rectifier electrostatic protection structure, comprising:
providing a substrate of P-type;
forming a first N-type well, a second N-type well, and a third N-type well in the substrate;
forming a first P-type doped region in a top part of an edge region of the first N-type well;
forming first N-type doped regions located in the substrate at both sides of the first N-type well and arranged along a first direction;
forming first gate structures on a portion of the first N-type doped regions and on a portion of the first P-type doped region;
forming a plurality of second gate structure groups at both sides of the first N-type well along a second direction; second N-type doped regions;
forming second P-type doped regions;
forming a third P-type doped region in the substrate; and
forming a cathode N-type doped region in the substrate, wherein:
the second N-type well is disposed at sides of the first N-type well and surrounds the first N-type well;
the third N-type well is disposed under a bottom of the first N-type well, and adjoins the first N-type well and to a bottom of the second N-type well;
the first N-type doped regions located at both sides of the first N-type well are disposed in the substrate between the first N-type well and the second N-type well;
the first N-type doped regions adjoin the first P-type doped region;
the plurality of second gate structure groups located at both sides of the first N-type well is disposed on the substrate between the first N-type well and the second N-type well;
each of the plurality of second gate structure groups includes two second gate structures arranged along the first direction;
the second direction is perpendicular to the first direction;
the second N-type doped regions are disposed in the substrate at both sides of each second gate structure along the first direction, and are separated from the first N-type well and from the second N-type well;
the second N-type doped regions at both sides of the plurality second gate structure groups along the first direction adjoin the first N-type doped regions;
the second P-type doped regions are disposed in a portion of the second N-type doped regions between adjacent second gate structure groups of the plurality of second gate structure groups along the first direction;
the third P-type doped region surrounds the second N-type well and is separated from the second N-type well;
the third P-type doped region is electrically connected to the second N-type doped regions between adjacent second gate structures in each second gate structure group;
the cathode N-type doped region surrounds the third P-type doped region and is separated from the third P-type doped region; and
each of the second N-type well, the third P-type doped region, and the cathode N-type doped region has a ring structure and sequentially surrounds the first N-type well.

12. The method according to claim 11, further including forming an anode N-type doped region in the top part of the first N-type well, wherein:
the first P-type doped region surrounds the anode N-type doped region and is separated from the anode N-type doped region; and
the anode N-type doped region is electrically connected to the first P-type doped region.

13. The method according to claim 12, further including forming a first connecting line electrically connecting the anode N-type doped region to the first P-type doped region.

14. The method according to claim 11, further including forming second connecting lines, wherein:
for each second connecting line, an end is connected to a second N-type doped region between two adjacent second gate structures in each second gate structure group, and another endo is connected to the third P-type doped region.

15. The method according to claim 11, further including forming a third connecting line, wherein:
the third connecting line electrically connects the second N-type doped regions between adjacent second gate structure groups along the first direction, the second P-type doped regions, and the second N-type doped regions at both sides of the plurality of second gate structure groups along the first direction.

16. The method according to claim 11, wherein:
a concentration of N-type ions in the third N-type well is smaller than a concentration of N-type ions in the first N-type well and is smaller than a concentration of N-type ions in the second N-type well.

17. The method according to claim 16, wherein:
the concentration of the N-type ions in the third N-type well is about ½ to about ¾ of the concentration of the N-type ions in the first N-type well.

18. The method according to claim 11, wherein:
the first P-type doped region has a ring structure;
the first N-type doped regions are located at both sides of the first N-type well along the first direction; and the plurality of second gate structure groups is located at both sides of the first N-type well along the second direction.

19. The method according to claim 11, wherein:
the substrate includes a semiconductor substrate and a plurality of fins on the semiconductor substrate; and
the plurality of fins extends along the first directions.

20. The method according to claim 11, wherein:
the first gate structures and the second gate structures extend along the second direction.

\* \* \* \* \*